(12) United States Patent
Koller et al.

(10) Patent No.: US 12,324,275 B2
(45) Date of Patent: Jun. 3, 2025

(54) GROWTH STRUCTURE FOR A RADIATION-EMITTING SEMICONDUCTOR COMPONENT, AND RADIATION-EMITTING SEMICONDUCTOR COMPONENT

(71) Applicant: OSRAM Opto Semiconductors GmbH, Regensburg (DE)

(72) Inventors: Andreas Koller, Regensburg (DE); Bernd Mayer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 203 days.

(21) Appl. No.: 17/435,321

(22) PCT Filed: Feb. 21, 2020

(86) PCT No.: PCT/EP2020/054648
§ 371 (c)(1),
(2) Date: Aug. 31, 2021

(87) PCT Pub. No.: WO2020/182444
PCT Pub. Date: Sep. 17, 2020

(65) Prior Publication Data
US 2022/0131033 A1 Apr. 28, 2022

(30) Foreign Application Priority Data
Mar. 14, 2019 (DE) .......................... 102019106521.6

(51) Int. Cl.
*H01L 21/02* (2006.01)
*H10H 20/815* (2025.01)
*H10H 20/824* (2025.01)

(52) U.S. Cl.
CPC ..... *H10H 20/815* (2025.01); *H01L 21/02395* (2013.01); *H01L 21/02576* (2013.01); *H10H 20/8242* (2025.01)

(58) Field of Classification Search
CPC . H01L 33/12; H01L 33/305; H01L 21/02395; H01L 21/02576; H10H 20/815; H10H 20/8242; H10H 20/824
See application file for complete search history.

(56) References Cited

U.S. PATENT DOCUMENTS 5,239,550 A 8/1993 Jain
6,355,951 B1 * 3/2002 Hattori .............. H01L 21/28587
257/E21.453

(Continued)

FOREIGN PATENT DOCUMENTS

| CN | 102067343 A | 5/2011 |
| JP | H02194651 A | 8/1990 |
| JP | 2000216496 A | 8/2000 |

OTHER PUBLICATIONS

Drechsel, Phillip S., "Metalorganic Vapor Phase Epitaxy of Group III Nitride-Based LED Structures on Silicon," Thesis at the Humboldt University of Berlin, Jul. 7, 1982, 2 pages.

(Continued)

*Primary Examiner* — Eric K Ashbahian
*Assistant Examiner* — Halee Cramer
(74) *Attorney, Agent, or Firm* — Slater Matsil, LLP

(57) ABSTRACT

In an embodiment a growth structure for a radiation-emitting semiconductor component includes a semiconductor substrate containing a material based on arsenide compound semiconductors and a buffer structure arranged on the semiconductor substrate, wherein the buffer structure includes a buffer layer having at least one n-doped layer and wherein the n-doped layer contains oxygen, and a molar fraction of oxygen in the n-doped layer is between $10^{15}$ cm$^{-3}$ and $10^{19}$ cm$^{-3}$, inclusive.

16 Claims, 2 Drawing Sheets

(56) References Cited

U.S. PATENT DOCUMENTS

| | | | |
|---|---|---|---|
| 8,956,897 B2 | 2/2015 | Rode et al. | |
| 2004/0124424 A1* | 7/2004 | Tatsumi | H01S 5/2231 |
| | | | 438/22 |
| 2006/0255367 A1* | 11/2006 | Yamada | H10D 10/021 |
| | | | 257/E29.189 |
| 2008/0080580 A1 | 4/2008 | Takayama et al. | |
| 2010/0166033 A1 | 7/2010 | Chin et al. | |
| 2011/0104836 A1 | 5/2011 | Rode et al. | |
| 2015/0364547 A1* | 12/2015 | Vizbaras | H01L 21/02466 |
| | | | 438/478 |
| 2018/0033912 A1* | 2/2018 | Bhusal | H01L 33/405 |
| 2018/0166607 A1* | 6/2018 | Wu | H01L 33/06 |
| 2021/0103231 A1* | 4/2021 | Seki | B41J 2/45 |

OTHER PUBLICATIONS

Shinohara, M., "Dislocation-free GaAs expitaxial growth with the use of modulation-doped AlAs—GaAs superlattice buffer layers," Appl. Phys. Lett. vol. 52, No. 7, Jun. 4, 1988, 4 pages.

Su, J., "Infrared Material and Detection Technology," Zhejiang Science and Technology Publishing House, Oct. 31, 2015, 5 pages. (Abstract in English only).

\* cited by examiner

GROWTH STRUCTURE FOR A RADIATION-EMITTING SEMICONDUCTOR COMPONENT, AND RADIATION-EMITTING SEMICONDUCTOR COMPONENT

This patent application is a national phase filing under section 371 of PCT/EP2020/054648, filed Feb. 21, 2020, which claims the priority of German patent application 102019106521.6, filed Mar. 14, 2019, each of which is incorporated herein by reference in its entirety.

TECHNICAL FIELD

A growth structure for a radiation-emitting semiconductor component is specified, particularly containing a material based on arsenide compound semiconductors.

BACKGROUND

GaAs growth substrates are known to have the problem of a comparatively high dislocation density. While silicon wafers usually have a very low dislocation density of less than 100 $cm^{-2}$, the dislocation density of GaAs wafers, on the other hand, is $10^5$ $cm^{-2}$. Dislocations that occur in the GaAs substrate can migrate further into overlying layers of a grown semiconductor structure. As a result, a radiation-emitting semiconductor component with such a semiconductor structure or luminescent diode structure can experience spontaneous failures and increased aging during operation. The buffer layers or ELOG (Epitaxial Lateral Overgrowth) masking layers used so far cannot prevent this problem or can do so only with considerable effort.

SUMMARY

Embodiments provide a growth structure and a radiation-emitting semiconductor component with improved crystal quality at acceptable manufacturing costs. A growth structure for a radiation-emitting semiconductor component is specified. In particular, the growth structure is suitable for a laser diode. According to at least one embodiment, the growth structure comprises a semiconductor substrate containing a material based on arsenide compound semiconductors. Furthermore, the growth structure comprises a buffer structure arranged on the semiconductor substrate and containing a material based on arsenide compound semiconductors.

"Based on arsenide compound semiconductors" in this context means that a structure or part of a structure so designated preferably comprises $Al_nGa_mIn_{1-n-m}As$, where $0 \leq n \leq 1$, $0 \leq m \leq 1$ and $n+m \leq 1$. This material need not necessarily have a mathematically exact composition according to the above formula. Rather, it may include one or more dopants as well as additional constituents that do not substantially change the physical properties of the material.

According to at least one embodiment, a semiconductor substrate consisting of GaAs is used for the growth structure. Arsenide compound semiconductor based semiconductor substrates or growth structures are particularly suitable for the manufacture of radiation-emitting semiconductor components based on arsenide or phosphide compound semiconductors.

The buffer structure comprises a buffer layer which comprises at least one n-doped layer containing oxygen. Thus, the at least one n-doped layer is an oxygen-containing layer. A molar fraction of oxygen in the n-doped layer is between $10^{15}$ $cm^{-3}$ and $10^{19}$ $cm^{-3}$. In particular, the molar fraction of oxygen in the n-doped layer is greater than $10^{15}$ $cm^{-3}$ and is at most $10^{19}$ $cm^{-3}$.

The oxygen can be incorporated—for example like a dopant—into a crystal structure of the n-doped layer. Advantageously, the oxygen in the n-doped layer contributes to the compensation of the dislocation density of the semiconductor substrate.

In a preferred embodiment, the molar fraction of oxygen in the n-doped oxygen-containing layer is between $10^{17}$ $cm^{-3}$ and $10^{18}$ $cm^{-3}$. In other words, the molar fraction can be at least 100 ppm and at most 20,000 ppm. Again, deviations of up to 10% are quite tolerable. With a molar fraction in the ranges indicated, it is possible that a large part of the dislocation lines will be kinked so that they do not reach a surface of the growth substrate intended for growing the luminescent diode structure.

Preferably, the buffer layer or buffer structure is n-doped as a whole, which ensures the electrical conductivity of the buffer layer or buffer structure during operation of the radiation-emitting semiconductor component. In particular, several layers contained in the buffer structure are n-doped with the same dopant.

According to at least one embodiment, the buffer structure or layers contained in the buffer structure is/are grown on the semiconductor substrate. This can be done by epitaxial deposition, for example by means of MOCVD (Metal-Organic Chemical Vapour Deposition), MBE (Molecular Beam Epitaxy) or LPE (Liquid Phase Epitaxy). Compared to the production of a growth structure, in which an ELOG masking layer is created on the semiconductor substrate, the complex structuring of the masking layer is not required here.

The dislocation density mentioned above is the total length of all dislocation lines per unit volume in a crystalline solid. In conventional semiconductor components, the dislocation lines extend from the growth substrate into the luminescent diode structure, where they cause impurities. This problem is solved in particular by means of the buffer layer.

According to at least one embodiment, the semiconductor substrate has dislocation lines which continue into the buffer structure and are kinked by means of the buffer layer. The inventors have found that in particular the oxygen used in the buffer layer causes kinking of the dislocation lines of the semiconductor substrate, so that they cannot penetrate into the luminescent diode structure for the most part, and the luminescent diode structure is therefore largely dislocation-free or the dislocation density attains an insignificant order of magnitude.

According to at least one embodiment, the at least one n-doped oxygen-containing layer contains AlGaAsO. Since AlGaAs or AlGaAsO has almost the same lattice constant as GaAs, the less common gallium can advantageously be replaced at least in part by the more common aluminum. In this context, a molar fraction of aluminum is preferably between 1% and 100% inclusive, particularly preferably between 1% and 60% inclusive. In other words, the at least one n-doped layer contains $Al_mGa_{1-m}As:O$, where $0.01 \leq m \leq 1$, particularly preferably $0.01 \leq m \leq 0.6$. Deviations of up to 10% are quite tolerable. For example, oxygen is introduced into a GaAs material with a complex aluminum compound, forming AlGaAsO. In particular, the at least one n-doped oxygen-containing layer consists of AlGaAsO.

Furthermore, the at least one n-doped oxygen-containing layer is preferably free of indium.

In an advantageous embodiment, the buffer layer consists of an n-doped oxygen-containing layer. In this case, the buffer layer is a so-called bulk layer. In other words, the buffer layer is largely homogeneous, i.e. made of only a single material, and is comparatively thick or stable. For example, the n-doped oxygen-containing layer or buffer layer can have a thickness between 50 nm and 800 nm inclusive. The preferred material for the n-doped oxygen-containing layer or buffer layer is AlGaAsO, i.e. oxygenated AlGaAs. Furthermore, the n-doped layer can be n-doped with dopants such as Te and/or Si. In addition, the buffer layer is designed in particular to be largely uninterrupted.

In a further embodiment, the buffer layer may comprise at least one n-doped oxygen-free layer, i.e. a layer without oxygen, and at least one n-doped oxygen-containing layer, which are arranged one on top of the other. In particular, the buffer layer comprises a plurality of respectively n-doped oxygen-free layers and a plurality of respectively n-doped oxygen-containing layers, which are arranged alternately. The at least one oxygen-containing layer may be formed of AlGaAsO. GaAs is preferably considered for the at least one oxygen-free layer. Particularly preferably, the buffer layer consists of a superlattice, that is, a sequence of thin layers that are periodically repeated. For example, the superlattice may have 5 to 20 repetitions. In this case, the at least one oxygen-free layer may be thicker than the at least one oxygen-containing layer. Preferably, the at least one oxygen-free layer is formed with a thickness between and including 0.5 nm, corresponding to a monolayer, preferably 2 nm, and 10 nm. Furthermore, the thickness of the at least one oxygen-containing layer may be between 0.5 nm, preferably 1 nm, and 5 nm. Deviations of up to 10% are quite tolerable. For example, tellurium, silicon or sulfur can be used as the n-dopant for the at least one oxygen-free layer. The same n-dopant can be used for doping both the oxygen-containing and the oxygen-free layers.

According to at least one embodiment, the buffer structure consists of the buffer layer, that is, the buffer structure comprises no layers other than the buffer layer.

Alternatively, the buffer structure may comprise at least one further buffer layer. The further buffer layer is arranged, for example, on a side of the above-described first buffer layer facing the semiconductor substrate. The further, second buffer layer may contain GaAs and be n-doped. For example, tellurium, silicon or sulfur may be used as the n-dopant for the further buffer layer. In particular, the second buffer layer is free of oxygen. If the buffer structure comprises a further buffer layer, the first buffer layer can be thinner. In this case, a thickness of about 10 nm may already be sufficient.

In addition or alternatively, the buffer structure can comprise a further buffer layer on a side of the first buffer layer facing away from the semiconductor substrate. This buffer layer, too, can contain GaAs and be doped with an n-dopant such as tellurium, silicon or sulfur and be free of oxygen.

According to at least one embodiment, the buffer structure comprises a first buffer layer consisting of a superlattice having the above-mentioned properties, and a second and/or third buffer layer (each) formed as a bulk layer having the above-mentioned properties.

By means of the further buffer layer(s), the crystal quality of the growth structure can be further improved. In addition, the lattice constant of the growth structure can be further approximated to the lattice constant of the semiconductor substrate.

Furthermore, it is conceivable that the buffer structure comprises a first buffer layer, which is formed as a bulk layer with the above-mentioned properties, and further comprises a second and/or third buffer layer, which (each) consist of a superlattice having the above-mentioned properties.

For example, the at least one further buffer layer can serve as an etch stop layer when the semiconductor substrate or the growth structure is detached from the luminescent diode structure.

A radiation-emitting semiconductor component comprising a growth structure as described above is specified. Thus, in particular, the growth structure comprises a semiconductor substrate which contains a material based on arsenide compound semiconductors. Furthermore, the growth structure comprises a buffer structure which is arranged on the semiconductor substrate, which contains a material based on arsenide compound semiconductors, and which includes a buffer layer having at least one n-doped layer containing oxygen.

Furthermore, the radiation-emitting semiconductor component comprises a luminescent diode structure based on arsenide or phosphide compound semiconductors and comprising a first region of a first conductivity type, a second region of a second conductivity type, and an active region arranged between the first and second regions for generating radiation, wherein the luminescent diode structure is grown onto the growth structure. Preferably, the first region is an n-type conductive region and the second region is a p-type conductive region. Particularly preferably, the first region is arranged on a side of the active region facing the growth structure, while the second region is located on a side of the active region facing away from the growth structure.

"Based on arsenide or phosphide compound semiconductors" in this context means that a structure or part of a structure so designated preferably comprises $Al_nGa_mIn_{1-n-m}As$ or $Al_nGa_mIn_{1-n-m}P$, where $0 \leq n \leq 1$, $0 \leq m \leq 1$ and $n+m \leq 1$. This material need not necessarily have a mathematically exact composition according to the above formula. Rather, it may include one or more dopants as well as additional constituents that do not substantially change the physical properties of the material. For the sake of simplicity, however, the above formula includes only the essential constituents of the crystal lattice (Al, Ga, In, P), even if these may be partially replaced by small amounts of other substances.

For example, the luminescent diode structure may be epitaxially grown onto the growth structure by MOCVD (Metal-Organic Chemical Vapor Deposition), MBE (Molecular Beam Epitaxy) or LPE (Liquid Phase Epitaxy).

The luminescent diode structure based on arsenide or phosphide compound semiconductors or its active region is particularly suitable for generating radiation with a wavelength in the red (InxGayAl1−x−yP) to infrared (InxGayAl1−x−yAs) spectral range. In particular, the radiation-emitting semiconductor component emits radiation having a wavelength between 750 nm and 1200 nm during operation.

The active region of the luminescent diode structure preferably has a pn junction, a double heterostructure, a single quantum well structure (SQW) or a multiple quantum well structure (MQW) for generating radiation. In particular, in the context of the application, the term quantum well structure includes any structure in which charge carriers can undergo quantization of multiple energy states by confinement. In particular, the term quantum well structure does not include any indication of the dimensionality of the quantization. Thus, it includes, but is not limited to, quantum wells, quantum wires and quantum dots and any combination of these structures.

The n-type region, the active region, and the p-type region may each have one or more layers.

According to at least one embodiment, the radiation-emitting semiconductor component is a laser diode, i.e. a coherent emitter. In particular, the laser diode is a high power laser diode that provides a radiation output of from 20 W to 300 W, inclusive, at a current of between 20 A and 300 A. To achieve such a radiation output, the luminescent diode structure of the semiconductor component may be in the form of a laser bar and have a plurality of adjacent strip-like regions that are electrically operated in parallel. In particular, the semiconductor component has at least ten adjacent strip-like regions.

According to a preferred embodiment, the radiation-emitting semiconductor component is an edge emitter. This means that the radiation generated by the active region emerges from at least one side surface of the semiconductor component. The side surfaces limit the semiconductor component in lateral directions, that is, in directions that are transverse, in particular perpendicular, to a growth direction of the luminescent diode structure. The growth direction indicates the direction in which the layers of the luminescent diode structure are successively deposited on the growth structure.

Alternatively, the radiation-emitting component may be a surface emitter. In this case, the radiation generated in the active region emerges at a main surface of the semiconductor component. The main surface limits the semiconductor component to the outside on a side of the luminescent diode structure facing away from the growth structure. It is true that the radiation output that can be achieved with a surface emitter is generally lower than with an edge emitter. However, surface emitters often have better beam quality.

Overall, the use of the radiation-emitting semiconductor component determines whether it is designed as an edge emitter or as a surface emitter. While edge emitters are used, for example, as pump lasers, surface emitters are used, for example, as optical transmitters for fiber optic data transmission and further for laser printers.

BRIEF DESCRIPTION OF THE DRAWINGS

Further advantages, preferred embodiments and further developments of the growth structure as well as of the radiation-emitting semiconductor component will become apparent from the following explanations in connection with FIGS. 1 to 4.

Elements that are identical, similar or have the same effect are given the same reference signs in the figures.

DETAILED DESCRIPTION OF ILLUSTRATIVE EMBODIMENTS

FIGS. 1 to 4 are each schematic representations and therefore not necessarily drawn to scale. Rather, comparatively small elements and, in particular, layer thicknesses may be shown exaggeratedly large for clarification purposes.

Figure 1:
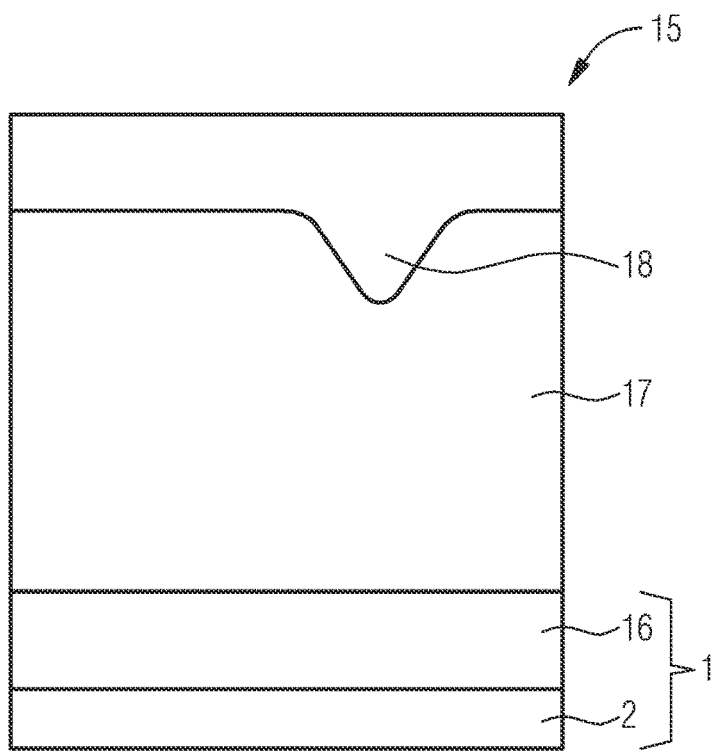
FIG. 1 shows a schematic view of a TEM image of a conventional semiconductor structure based on nitride compound semiconductors (source: dissertation "Metallorganische Gasphasen-Epitaxie von Gruppe III-Nitrid-basierten LED Strukturen auf Silizium" (*Metal-Organic Vapor Phase Epitaxy of Group III Nitride-based LED Structures on Silicon*), page 136, FIG. 5.36, 1982 Jul. 7, Sebastian Drechsel)

FIG. 1 shows a conventional semiconductor structure 15 based on nitride compound semiconductors.

"Based on nitride compound semiconductors" in the present context means that the active epitaxial layer sequence or at least one layer thereof comprises a nitride III/V compound semiconductor material.

The semiconductor structure 15 comprises a growth structure 1 and a semiconductor layer sequence 17 grown thereon. The growth structure 1 comprises a semiconductor substrate 2 and an ELOG (Epitaxial Lateral Overgrowth) masking layer 16 deposited on the semiconductor substrate 2. The ELOG masking layer 16 is provided to reduce the dislocation density in the semiconductor structure 15. The masking layer 16 is formed of SiN, while the semiconductor substrate 2 consists of sapphire.

The ELOG masking layer 16 has a plurality of recesses (not marked) through which the semiconductor layer sequence 17 is formed on the semiconductor substrate 2 by epitaxial growth. Since dislocations can only propagate through the recesses, the growth structure 1 has a reduced dislocation density on a side facing the semiconductor layer sequence 17 compared to the semiconductor substrate 2.

As can be seen from FIG. 1, breakthroughs 18 of impurities nevertheless occur. In addition, the production of the recesses in the ELOG masking layer 16, for example by photolithographic structuring, is comparatively costly.

Figure 2:
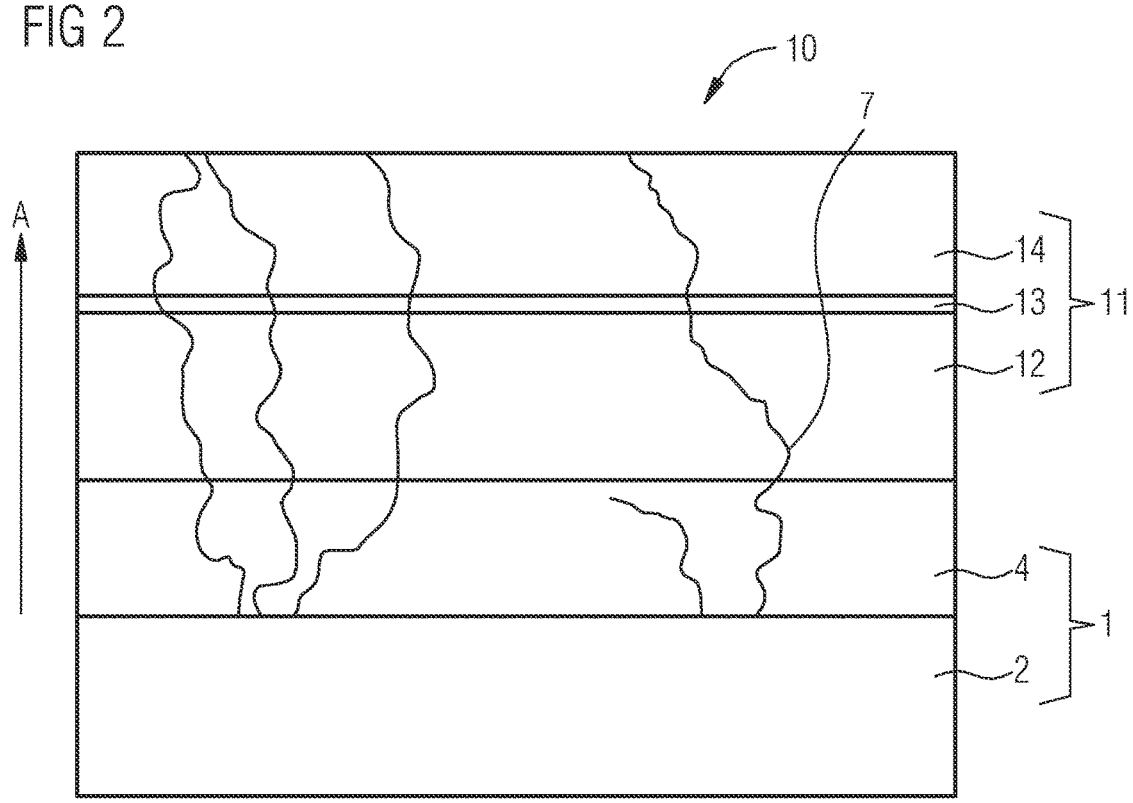
FIG. 2 shows a schematic cross-sectional view of a radiation-emitting semiconductor component according to a comparative example.

FIG. 2 shows a comparative example of a radiation-emitting semiconductor component 10. The radiation-emitting semiconductor component 10 comprises a growth structure 1 and a luminescent diode structure 11 arranged thereon for generating radiation, preferably in the infrared range.

The growth structure 1 comprises a semiconductor substrate 2 made of GaAs with a comparatively high dislocation density. To reduce the dislocation density, the growth structure 1 includes a buffer layer 4 which is arranged on the semiconductor substrate 2 and on which the luminescent diode structure 11 is grown.

The buffer layer 4 is an n-doped layer of GaAs which is free of oxygen. For example, tellurium is used as the n-dopant.

The luminescent diode structure 11 is deposited on the growth structure 1. The luminescent diode structure 11 contains materials based on arsenide compound semiconductors. Adjacent to the growth structure 1, the luminescent diode structure 11 comprises a first, n-type region 12 followed in a growth direction A by an active region 13 for generating radiation. The active region 13 is followed in the growth direction A by a second, p-type region 14.

The buffer layer 4 included in the growth structure 1 can be formed largely without dislocations. However, the buffer layer 4 cannot sufficiently prevent migration of the dislocation lines 7 from the semiconductor substrate 2 into the luminescent diode structure 11 during growth of the luminescent diode structure 11 or later during operation of the component. As shown in FIG. 2, the dislocation lines 7 extend from the semiconductor substrate 2 through the first region 12 and the active region 13 into the second region 14, thereby degrading the crystal quality of the radiation-emitting semiconductor component 10.

Overall, therefore, neither the masking layer 16 described in connection with FIG. 1 nor the buffer layer 4 described in connection with FIG. 2 can achieve a sufficiently high crystal quality at an acceptable manufacturing cost.

The situation is different in the embodiments described below in connection with FIGS. 3 and 4.

Figure 3:
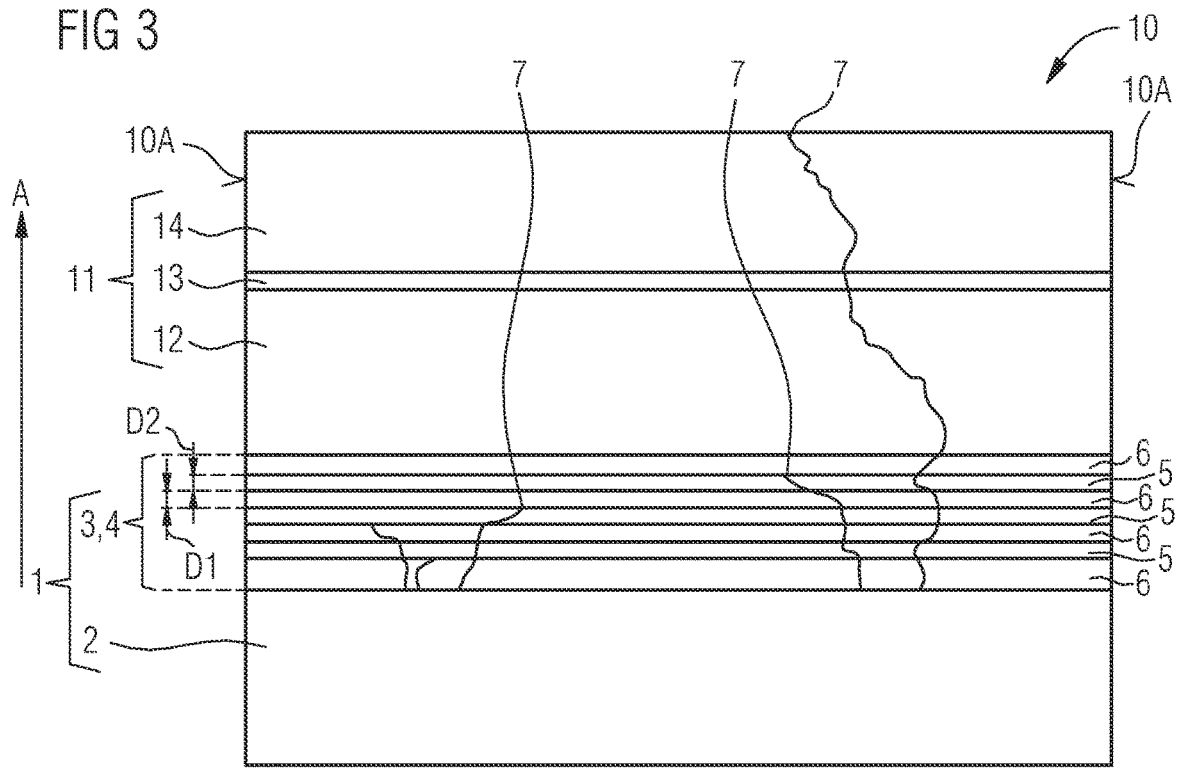
FIG. 3 shows a schematic cross-sectional view of a radiation-emitting semiconductor component according to a first embodiment.

The radiation-emitting semiconductor component 10 shown in FIG. 3 comprises a growth structure 1 and a luminescent diode structure 11 arranged thereon for generating radiation.

The growth structure 1 is a composite component comprising a semiconductor substrate 2 and a buffer structure 3 arranged on the semiconductor substrate 2. In particular, the semiconductor substrate 2 forms a growth substrate suitable for both growing the buffer structure 3 and growing the luminescent diode structure 11. Furthermore, the semiconductor substrate 2 advantageously forms a self-supporting stable base body and can serve as a carrier body in the finished radiation-emitting semiconductor component 10. Alternatively, the semiconductor substrate 2 can be removed or at least thinned and, for example, be replaced by another carrier.

Both the semiconductor substrate 2 and the buffer structure 3 are formed of materials based on arsenide compound semiconductors. Preferably, the semiconductor substrate 2 is made of GaAs.

The luminescent diode structure 11, too, may contain materials based on arsenide compound semiconductors. Alternatively, the luminescent diode structure 11 may contain materials based on phosphide compound semiconductors.

Suitable methods for producing the buffer and luminescent diode structures 3, 11 include MOCVD (Metal-Organic Chemical Vapor Deposition), MBE (Molecular Beam Epitaxy), or LPE (Liquid Phase Epitaxy).

In the embodiment shown in FIG. 3, the buffer structure 3 consists of a buffer layer 4 which comprises a superlattice. The buffer layer 4 comprises several n-doped, oxygen-free layers 6 and several n-doped, oxygen-containing layers 5, which are arranged on top of each other in alternating sequence. In particular, AlGaAsO is suitable as a material system for the oxygen-containing layers 5. In this case, a molar fraction of aluminum is preferably between 1% and 100% inclusive, in particular between 1% and 60% inclusive. In other words, the n-doped oxygen-containing layers 5 each contain $Al_mGa_{1-m}As{:}O$, where $0.01 \leq m \leq 1$, particularly preferably $0.01 \leq m \leq 0.6$. Preferably, the molar fraction of oxygen is greater than $10^{15}$ cm$^{-3}$ and is at most $10^{19}$ cm$^{-3}$. Particularly preferably, the molar fraction of oxygen in the n-doped layers 5 is between $10^{17}$ cm$^{-3}$. In other words, the molar fraction can be at least 100 ppm and at most 20,000 ppm. GaAs is particularly suitable for the oxygen-free layers 6. Deviations of up to 10% are quite tolerable for the indicated molar fractions. The same n-dopant can be used for doping both the oxygen-containing and the oxygen-free layers 6, 5.

The oxygen-free layers 6 preferably have a thickness D1 between and including 0.5 nm, preferably 2 nm, and 10 nm. Furthermore, the thickness D2 of the oxygen-containing layers 5 is in particular between 0.5 nm, preferably 1 nm, and 5 nm. Deviations of up to 10% are quite tolerable.

The luminescent diode structure 11 comprises a first region 12 of a first conductivity type, a second region 14 of a second conductivity type, and an active region 13 arranged between the first and second regions 12, 14 for generating radiation. Preferably, the first region 12 is an n-type conductive region and the second region 14 is a p-type conductive region. Furthermore, the first region 12 is arranged on a side of the active region 13 facing the growth structure 1, while the second region 14 is arranged on a side of the active region 13 facing away from the growth structure 1.

As can be seen in FIG. 3, dislocation lines 7 extend from the semiconductor substrate 2 into the buffer structure 3 or buffer layer 4.

By means of the buffer structure 3 or buffer layer 4, the dislocation lines 7 are largely kinked so that they do not migrate further into the luminescent diode structure 11. The inventors have found that in particular the oxygen used in the n-doped layers 5 causes the dislocation lines to kink so that they cannot for the most part penetrate into the luminescent diode structure 11.

This effect can also be achieved with a buffer structure 3 that does not consist of only one buffer layer 4 as in the illustrated exemplary embodiment, but comprises at least one further buffer layer (not shown). A further buffer layer may be arranged on a side of the buffer layer 4 facing the semiconductor substrate 2 or on a side of the buffer layer 4 facing away from the semiconductor substrate 2. Two further buffer layers may also be provided, in which case the buffer layer 4 is arranged between them. The at least one further buffer layer may contain GaAs, be free of oxygen and furthermore be n-doped. For example, tellurium can be used as the n-dopant. Furthermore, it is conceivable that the at least one further buffer layer is designed as a bulk layer with the properties described below in connection with FIG. 4.

The radiation-emitting semiconductor component 10 is designed as a laser diode which, in particular, emits radiation in the infrared range with a wavelength between 750 nm and 1200 nm. Furthermore, the radiation-emitting semiconductor component 10 shown is an edge emitter which emits the radiation generated by the active region 13 at a side surface of the semiconductor component 10 arranged parallel to the image plane. The side surfaces 10A as well as the side surfaces arranged parallel to the image plane (not shown) limit the semiconductor component 10 in lateral directions, i.e. in directions extending transversely, in particular perpendicularly, to a growth direction A of the luminescent diode structure. The growth direction A indicates the direction in which the regions 12, 13, 14 of the luminescent diode structure 11 are successively applied to the growth structure 1.

In particular, the radiation-emitting component 10 is a high power laser diode that yields a radiation output of from 20 W to 300 W, inclusive, at a current of between 20 A and 300 A. To achieve such a radiation output, the luminescent diode structure 11 of the semiconductor component 10 may be in the form of a laser bar, comprising a plurality of adjacent strip-like regions each having a structure as shown in FIG. 3.

Figure 4:
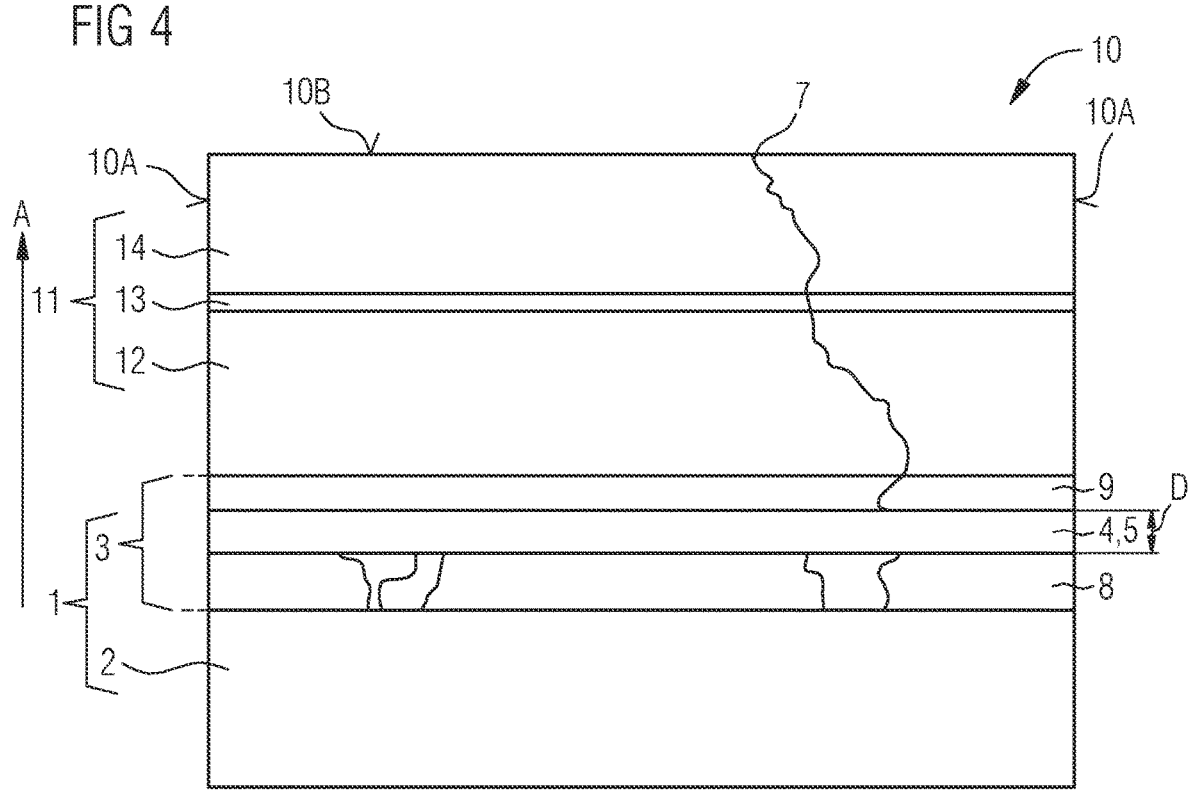
FIG. 4 shows a schematic cross-sectional view of a radiation-emitting semiconductor component according to a second embodiment.

The exemplary embodiment of a radiation-emitting semiconductor component 10 shown in FIG. 4 has a similar structure to that of the semiconductor component 10 shown in FIG. 3. In this respect, reference is made to the explanations given above. Differences exist in the buffer structure 3, which will be discussed in more detail below.

The radiation-emitting semiconductor component 10 comprises a growth structure 1 and a luminescent diode structure 11 arranged thereon for generating radiation. Both structures 1, 11 may contain materials based on arsenide compound semiconductors. Alternatively, the luminescent diode structure 11 may be formed of materials based on phosphide compound semiconductors.

The growth structure 1 comprises a semiconductor substrate 2, preferably a GaAs substrate, and a buffer structure 3 grown in particular on the semiconductor substrate 2.

The buffer structure 3 comprises a first buffer layer 4 consisting of an n-doped, oxygen-containing layer 5. The buffer layer 4 has AlGaAs as the material system, which is oxygenated. The buffer layer 4 is thus formed from AlGaAsO. The buffer layer 4 is a so-called bulk layer. In other words, the buffer layer 4 is largely homogeneous, i.e. made of only one material system, and is comparatively thick or stable.

In the exemplary embodiment shown in FIG. 4, the buffer structure 3 comprises two further buffer layers 8, 9, between which the first buffer layer 4 is arranged. In this case, the first buffer layer 4 can be formed comparatively thin with a thickness D of about 10 nm.

The second and third buffer layers 8, 9 can each contain GaAs and be n-doped, with tellurium being used as the n-dopant, for example. In particular, the buffer layers 8, 9 are free of oxygen. Alternatively, the second and third buffer layers 8, 9 can each consist of a superlattice as described in connection with the buffer layer 4 shown in FIG. 3.

Furthermore, it is conceivable that the buffer structure 3 comprises only one further buffer layer, which is arranged on a side of the first buffer layer 4 facing towards or away from the semiconductor substrate 2.

It is also possible for the buffer structure 3 to consist only of the buffer layer 4. In this case, the buffer layer 4 is comparatively thick with a preferred thickness D of between 50 nm and 150 nm inclusive, with deviations of up to 10% being tolerable.

The radiation-emitting component 10 is preferably an edge-emitting laser diode having the characteristics already described in connection with FIG. 3. However, the radiation-emitting semiconductor component 10 may also be a surface-emitting laser diode in which the radiation is coupled out at a main surface 10B of the semiconductor component 10.

Overall, the crystal quality of the luminescent diode structures 11 can be improved by means of the buffer structures 3 described herein, so that fewer failures occur in the semiconductor components 10 and the operating life can be extended.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or embodiments.

The invention claimed is:

1. A growth structure for a radiation-emitting semiconductor component comprising:
    a semiconductor substrate containing a material based on arsenide compound semiconductors; and
    a buffer structure, which is arranged on the semiconductor substrate and contains a material based on arsenide compound semiconductors,
    wherein the buffer structure comprises:
        a first buffer layer comprising at least one n-doped layer, wherein the n-doped layer contains a material based on arsenide compound semiconductors and oxygen, and a molar fraction of oxygen in the n-doped layer is between $10^{15}$ cm$^{-3}$ and $10^{19}$ cm$^{-3}$, and
        at least one second buffer layer, which contains a material based on arsenide compound semiconductors, is n-doped and contains oxygen,
    wherein the second buffer layer is configured to serve as an etch stop layer when the semiconductor substrate or the growth structure is detached from a luminescent diode structure, and
    wherein one of the first buffer layer or the second buffer layer is a bulk layer and the other one consists of a superlattice.

2. The growth structure according to claim 1, wherein the semiconductor substrate comprises dislocation lines which continue into the buffer structure and are kinked by the first buffer layer.

3. The growth structure according to claim 1, wherein the at least one n-doped layer contains AlGaAsO.

4. The growth structure according to claim 3, wherein the at least one n-doped layer contains AlmGa1−mAs:O and 0.01≤m≤1.

5. The growth structure according to claim 1, wherein the at least one n-doped layer consists of n-doped AlGaAsO.

6. The growth structure according to claim 1, wherein the molar fraction of oxygen in the n-doped layer is at least 100 ppm and at most 20,000 ppm.

7. The growth structure according to claim 1, wherein the first buffer layer consists of an n-doped oxygen-containing layer.

8. The growth structure according to claim 1, wherein the first buffer layer comprises at least one n-doped oxygen-free layer and at least one n-doped oxygen-containing layer arranged one on top of the other.

9. The growth structure according to claim 8, wherein the first buffer layer comprises a plurality of n-doped oxygen-free layers and a plurality of n-doped oxygen-containing layers arranged alternately.

10. The growth structure according to claim 8, wherein the at least one oxygen-free layer has a thickness between 0.5 nm and 10 nm, inclusive.

11. The growth structure according to claim 8, wherein the at least one oxygen-containing layer has a thickness between 0.5 nm and 5 nm, inclusive.

12. The growth structure according to claim 8, wherein the oxygen-free layer contains GaAs.

13. The growth structure according to claim 1, wherein the semiconductor substrate consists of GaAs.

14. The growth structure according to claim 1, wherein the buffer structure comprises at least one further buffer layer, which is n-doped and free of oxygen.

15. The radiation-emitting semiconductor component comprising:
    the growth structure according to claim 1; and
    the luminescent diode structure based on arsenide or phosphide compound semiconductors and having a first region of a first conductivity type, a second region of a second conductivity type, and an active region arranged between the first and second regions, the active region configured to generate radiation,
    wherein the luminescent diode structure is grown onto the growth structure.

16. The radiation-emitting semiconductor component according to claim 15, wherein the radiation-emitting semiconductor component is free of a transistor structure or a thyristor structure between the buffer structure and the active region.

* * * * *